United States Patent [19]

Sakai

[11] Patent Number: 5,296,742

[45] Date of Patent: Mar. 22, 1994

[54] MULTILAYERED INTEGRATED CIRCUIT CHIP WIRING ARRANGEMENT

[75] Inventor: Isami Sakai, Tokyo, Japan

[73] Assignee: NEC Corporation, Tokyo, Japan

[21] Appl. No.: 795,731

[22] Filed: Nov. 21, 1991

[30] Foreign Application Priority Data

Nov. 21, 1990 [JP] Japan .................................. 2-316906

[51] Int. Cl.$^5$ ............................................. H01L 23/48
[52] U.S. Cl. ................................... 257/758; 257/760; 257/776
[58] Field of Search ................. 357/65, 23.5; 257/750, 257/758, 760, 773, 775, 776

[56] References Cited

U.S. PATENT DOCUMENTS

| | | | |
|---|---|---|---|
| 4,594,606 | 6/1986 | Goto et al. | 357/65 |
| 4,984,060 | 1/1991 | Ohmi et al. | 357/65 |
| 4,996,584 | 2/1991 | Young et al. | 357/65 |

OTHER PUBLICATIONS

*Semiconductor Devices Physics and Technology*, S. M. Sze, p. 344 1985.

*Primary Examiner*—William Mintel
*Assistant Examiner*—Roy Potter
*Attorney, Agent, or Firm*—Burns, Doane, Swecker & Mathis

[57] ABSTRACT

An integrated circuit chip includes a substrate in which active circuits are formed, a lower layer of parallel conductors formed on the substrate, and one or more intermediate layers of insulating material on the lower-layer conductors, the intermediate layers having troughs corresponding to spaces where the lower-layer conductors are absent on the substrate and crests corresponding to spaces where the lower-layer conductors are present on the substrate. An upper layer of parallel conductors is formed on the insulative layers, the upper-layer conductors extending in a direction normal to the length of the lower-layer conductors. The upper-layer conductors have a minimum step coverage of 50%, and the lower-layer conductors have a ratio of a thickness thereof to a separation therebetween, which ratio is either equal to or greater than 0.45 or equal to or smaller than 0.25.

4 Claims, 2 Drawing Sheets

MULTILAYERED INTEGRATED CIRCUIT CHIP WIRING ARRANGEMENT

BACKGROUND OF THE INVENTION

The present invention relates to a multilayered integrated circuit chip.

Conventional integrated circuit chips are constructed of upper and lower layers of parallel conductors between which insulative layers of silicon dioxide and silica are interposed. The conductors of the underlying layer extend in a direction normal to the length of the conductors of the upper layer and are separated at intervals according to predetermined requirements. The insulative intermediate layers are deposited over the conductors of the underlying layer so that the spaces between adjacent lower-layer conductors are completely filled by insulating material. As viewed from ends of the underlying conductors, the insulators describe an undulating curve having troughs corresponding to the spaces where underlying conductors are absent and crests corresponding to the spaces where they are present. Since the upper conductors extend in a direction normal to the length of the underlying conductors, they follow the undulating curve of the insulators, producing thinner portions corresponding to the troughs of the curve and thicker portions corresponding to the crests. The ratio of maximum film thickness to minimum film thickness, or "step coverage", of the overlying conductors is reduced to a level not satisfactory from the viewpoint of what is called the "electromigration" of the overlying conductors.

SUMMARY OF THE INVENTION

It is therefore an object of the present invention to provide an integrated circuit chip in which the upper layer of parallel conductors has a step coverage of satisfactory values.

According to the present invention, the integrated circuit chip comprising a substrate in which active circuits are formed, a lower layer of parallel conductors formed on the substrate, and one or more intermediate layers of insulating material formed on the lower-layer conductors, the intermediate layers having troughs corresponding to spaces where the lower-layer conductors are absent on the substrate and crests corresponding to spaces where the lower-layer conductors are present on the substrate. An upper layer of parallel conductors is formed on the intermediate layers, the upper-layer conductors extending in a direction normal to the length of the lower-layer conductors. The upper-layer conductors have a minimum step coverage of 50%, and the lower-layer conductors have a ratio of a thickness thereof to a separation therebetween, which ratio is either to or greater than 0.45 or equal to or smaller than 0.25.

BRIEF DESCRIPTION OF THE DRAWINGS

The present invention will be described in further detail with reference to the accompanying drawings, in which.

DETAILED DESCRIPTION

Figure 1:
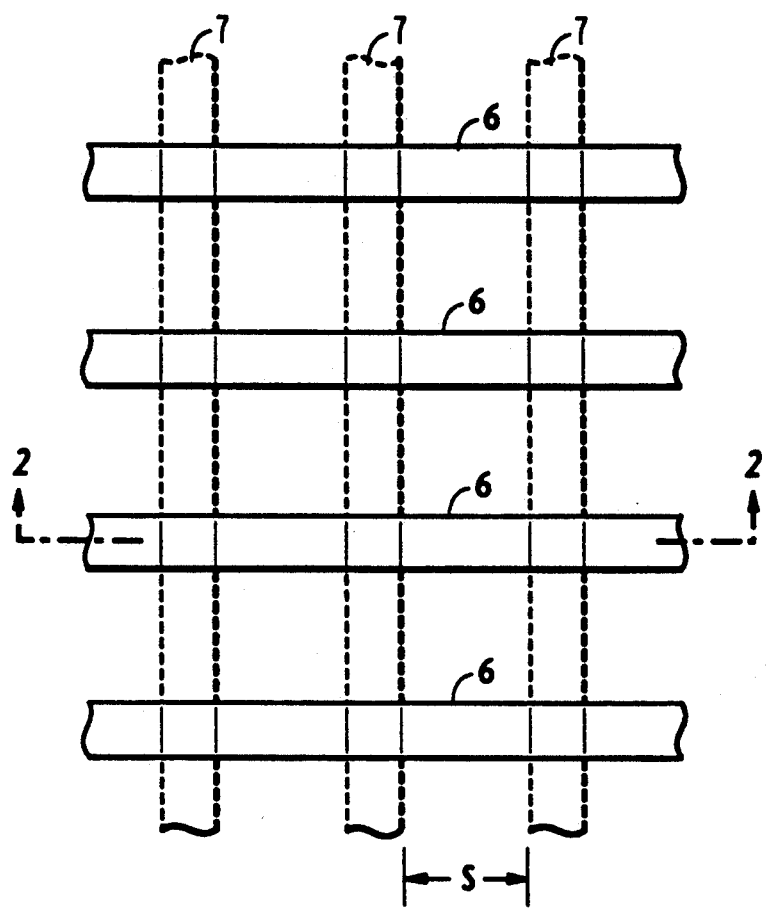
FIG. 1 is a top plan view of a portion of an integrated circuit chip.
Figure 2:
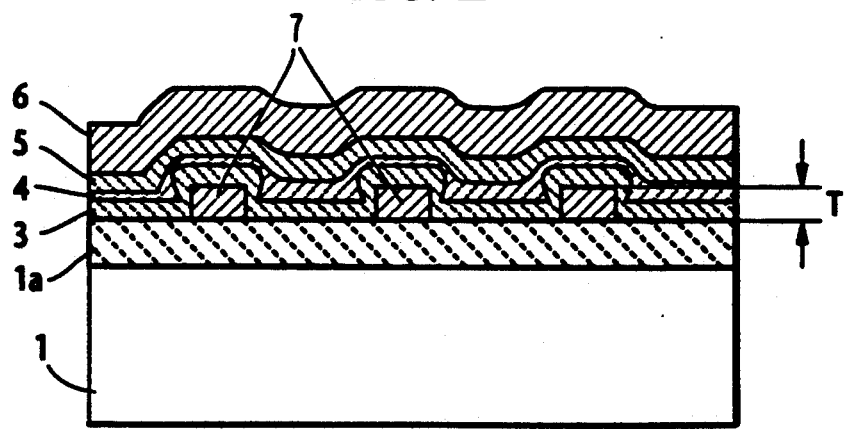
FIG. 2 is a cross-sectional view taken along the lines 2—2 of FIG. 1.

Referring now to FIGS. 1 and 2, the integrated circuit chip of the present invention includes a semiconductor substrate 1 in which active circuits such as bipolar and MOS transistors are formed and overlayed with a layer 1a of silicon dioxide. Using a photolithographic technique, parallel, lower-layer conductors 7 of aluminum are formed on the insulating layer 1a to a thickness T of 0.6 $\mu$m, for example, with a separation S between adjacent conductors. A lower layer 3 of silicon dioxide is deposited over the substrate 1, followed by successive depositions of a layer 4 of silica and an upper layer 5 of silicon dioxide. Parallel, upper-layer conductors 6 of aluminum are formed to a thickness of 1.0 $\mu$m on the insulative layer 5 so that they extend normal to the length of the underlying conductors 7. The conductors of the lower and upper layers are suitably coupled to the active circuits of the substrate through vertical conductors, not shown. The intermediate insulating layers 3, 4 and 5 undulate with spaces where the lower-layer conductors 7 are absent on substrate 1 and spaces where the lower-layer conductors are present on substrate 1, forming alternating troughs and crests.

Figure 3:
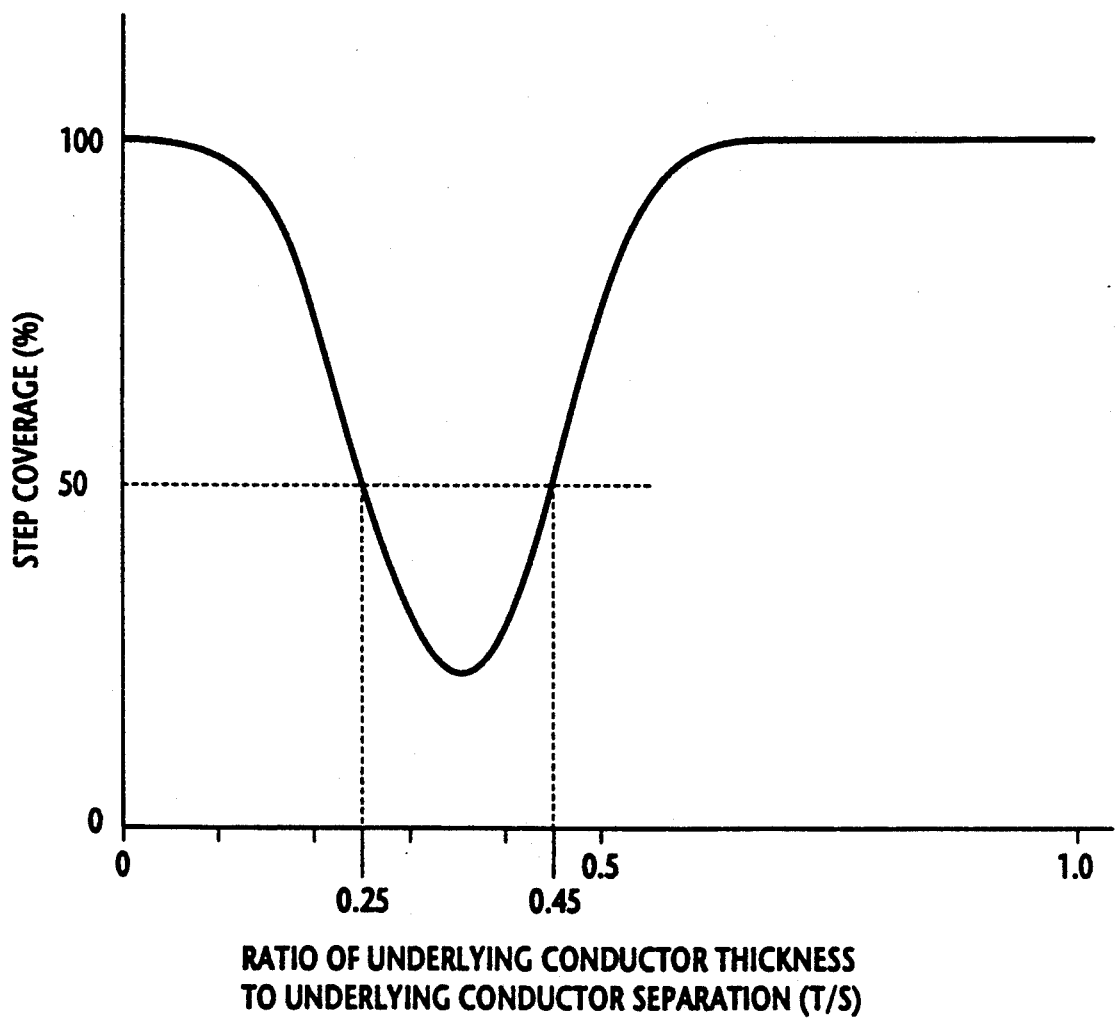
FIG. 3 is a graphic representation of step coverage plotted as a function of ratios of thickness to separation of lower-layer conductors.

According to experiments, the minimum value of step coverage of the upper-layer conductors 6 was found to be 50%. By plotting step coverage values of upper-layer conductors as a function of the ratio of lower-layer conductor thickness T to lower-layer conductor separation S, the step coverage adopts a curve as shown in FIG. 3. It is seen that step coverage values equal to or greater than 50% are satisfied when the ratio is equal to or smaller than 0.25, or equal to or greater than 0.45. To meet these requirements using a film thickness of 0.6 $\mu$m, the separation between conductors 7 must be equal to or smaller than 1.33 (=0.6/0.45) $\mu$m to give a ratio of 0.45 or greater, or must be equal to or greater than 2.4 (=0.6/0.25) $\mu$m to give a ratio of 0.25 or less.

If separations between lower-layer conductors are a multiple of a minimum separation and this minimum separation satisfies the ratio requirements just described, all the other separations also satisfy the requirements. For example, if the minimum separation of lower-layer conductors with a film thickness of 0.6 $\mu$m is 1.0 $\mu$m, giving a ratio of 0.6, multiples of the minimum separation, such as 1.5 $\mu$m and 3.0 $\mu$m, give ratios of 0.4 and 0.2, respectively, which satisfy the ratio requirements.

What is claimed is:

1. An integrated circuit chip, comprising:
   a substrate in which active circuits are formed;
   a lower layer of a plurality of parallel conductors formed over said substrate, a ratio of the thickness of the lower layer conductors to the separation between the lower layer conductors being within either of two ranges of values, one range having an upper limit of and including 0.25 and another range having a lower limit of and including 0.45;
   a first insulating layer of silicon dioxide over said lower layer conductors, a second insulating layer of silica over said first insulating layer, and a third insulating layer of silicon dioxide over said second insulating layer, said third insulating layer having troughs corresponding to spaces where the lower layer conductors are absent over said substrate and crests corresponding to spaces where the lower layer conductors are present over said substrate; and an upper layer of parallel conductors formed over said third insulating layer, the upper layer conductors extending in a direction normal to the length of said lower layer conductors, said upper layer conductors having a minimum step coverage of 50%.

2. An integrated circuit chip as claimed in claim 1, wherein said lower layer of a plurality of parallel conductors includes at least three parallel conductors.

3. An integrated circuit chip as claimed in claim 1, wherein the lower layer conductors are respectively spaced at an interval which is a multiple of a minimum value for said separation between the lower layer conductors.

4. An integrated circuit chip as claimed in claim 3, wherein said lower layer of a plurality of parallel conductors includes at least three parallel conductors.

* * * * *